(12) United States Patent
Ono et al.

(10) Patent No.: US 7,728,358 B2
(45) Date of Patent: Jun. 1, 2010

(54) SEMICONDUCTOR DEVICE AND METHOD FOR MANUFACTURING SAME

(75) Inventors: Masataka Ono, Kawasaki (JP); Akiko Fujita, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/187,619

(22) Filed: Aug. 7, 2008

(65) Prior Publication Data

US 2009/0039393 A1 Feb. 12, 2009

(30) Foreign Application Priority Data

Aug. 8, 2007 (JP) .............................. 2007-206174

(51) Int. Cl.
*H01L 31/072* (2006.01)
*H01L 31/109* (2006.01)
(52) U.S. Cl. ...................... 257/197; 257/183; 257/189; 438/235
(58) Field of Classification Search ................. 257/197, 257/183, 189, 200, E21.371; 438/235, 309
See application file for complete search history.

(56) References Cited

U.S. PATENT DOCUMENTS 5,504,018 A  4/1996  Sato
6,699,741 B1*  3/2004  Sadovnikov et al. ........ 438/197
2002/0142557 A1*  10/2002  Hashimoto et al. .......... 438/309

FOREIGN PATENT DOCUMENTS

| JP | 2003-045885 | 2/2003 |
| JP | 2003-188177 | 7/2003 |
| JP | 2005-057171 | 3/2005 |
| JP | 2004-193454 | 7/2007 |

OTHER PUBLICATIONS

Chinese Patent Office issued a Chinese Office Action dated Nov. 27, 2009, Application No. 200810145329.1.

* cited by examiner

*Primary Examiner*—Theresa T Doan
(74) *Attorney, Agent, or Firm*—Young & Thompson

(57) ABSTRACT

The semiconductor device, which provides reduced electric current leakage and parasitic resistance to achieve stable current gain, is provided. A first polycrystalline semiconductor layer is grown on a p-type polycrystalline silicon film exposed in a lower surface of a visor section composed of a multiple-layered film containing a p-type polycrystalline silicon film and a silicon nitride film, while growing the first semiconductor layer on a n-type collector layer, and then the first polycrystalline semiconductor layer is selectively removed. Further, a second growing operation for selectively growing the second polycrystalline semiconductor layer and the third polycrystalline semiconductor layer on the exposed portion of the p-type polycrystalline semiconductor film exposed in the lower surface of the visor section without contacting the silicon nitride film, while growing the second semiconductor layer and the third semiconductor layer, so that the third semiconductor layer is in contact with the third polycrystalline semiconductor layer.

2 Claims, 12 Drawing Sheets

PRIOR ART

SEMICONDUCTOR DEVICE AND METHOD FOR MANUFACTURING SAME

This application is based on Japanese patent application No. 2007-206174, the content of which is incorporated herein by reference.

BACKGROUND

1. Technical Field

The present invention relates to a semiconductor device and method for manufacturing the semiconductor device.

2. Related Art

A typical conventional process for forming a generally-used base layer in a hetero bipolar transistor is illustrated in FIGS. 11A to 11C and FIG. 12. The following description will be made in reference to selectively growing crystal of SiGe for forming the base layer. A silicon oxide film 14, a p-type polycrystalline silicon film 16 and a silicon nitride film are formed on a substrate 10, which is provided with an n-type collector layer 12, and a concave portion is provided in the silicon nitride film and the p-type polycrystalline silicon film 16. Further, the side wall of the concave portion is covered with a silicon nitride film to form a silicon nitride film 18. Then, a portion of the silicon oxide film 14 exposed over the bottom of the concave portion is etched, and further, a side etching in the transverse direction is conducted to provide an opening in the silicon oxide film 14 (FIG. 11A).

Next, a contamination in the surface is removed within hydrogen atmosphere at higher temperature, and then the base layer is formed in the bottom of the opening of the concave portion via a chemical vapor deposition (CVD) process. Available chemical compounds for a source gas for such CVD process includes hydrogen ($H_2$), dichlorosilane ($SiH_2Cl_2$), germane ($GeH_4$), diborane ($B_2H_6$), methylsilane ($SiH_3CH_3$) and the like. As shown in FIG. 11B, undoped SiGe is grown on the n-type collector layer 12 via an epitaxial process to form an SiGe monocrystalline layer 20. In such case, SiGe is grown on the exposed portion of the p-type polycrystalline silicon film 16 formed in the upper portion of the opening and exposed in the lower surface of a visor section of the p-type polycrystalline silicon film 16 including silicon nitride film 18 to form the SiGe polycrystalline layer 30.

Further, a p-type SiGe monocrystalline layer 22 doped with p-type impurity is formed, and SiGe is further deposited on the SiGe polycrystalline layer 30 to form a p-type SiGe polycrystalline layer 32 (FIG. 11C).

Subsequently, undoped SiGe monocrystalline layer 24 having an altered germanium ratio of SiGe and an undoped silicon layer 26 are respectively grown on the SiGe monocrystalline layer 22 to form a monocrystalline growth layer. In such case, an undoped SiGe polycrystalline layer 33 and an undoped silicon polycrystalline layer 34 are also deposited on the p-type SiGe polycrystalline layer 32 to form a polycrystalline layer, so that the polycrystalline layer is in con-tact with the monocrystalline layer and the polycrystalline layer also provides electrical coupling between the p-type polycrystalline silicon film 16 serving as the base drawing electrode and the base layer (FIG. 12).

Typical bipolar transistors having a base layer formed in the interior of an opening provided in the insulating layer are described in, for example, Japanese Patent Application Publication No. 2004-193454 and Japanese Patent Application Publication No. 2003-188177. Other related art documents includes Japanese Patent Application Publication No. 2003-45885 and Japanese Patent Application Publication No. 2005-57171.

Nevertheless, as shown in FIG. 12, a polycrystalline layer downwardly growing from the p-type polycrystalline silicon film 16 extends toward the transverse direction after being contacted with the monocrystalline layer, eventually being in direct contact with the portion of the silicon nitride film 18 exposed in the lower surface of the visor section. Larger dimensional area of such contact causes a larger stress generated due to a difference in thermal expansion coefficient between the silicon nitride film and the polycrystalline layer, leading to a creation of recombination energy level in vicinity of the emitter-base junction, so that a stable current gain is difficult to be obtained.

SUMMARY

According to one aspect of the present invention, there is provided a method for manufacturing a semiconductor device, comprising: providing, on a substrate provided with a collector layer having a first type conductivity, in sequence, a first insulating film, a polycrystalline semiconductor film having a second type conductivity and a second insulating film, the second type conductivity being inverse of the first type conductivity; selectively etching the second insulating film and the polycrystalline semiconductor film to provide a concave portion, a bottom of the concave portion including an exposed portion of the first insulating film; forming a third insulating film over the second insulating film and over a side wall of the concave portion while partially leaving the concave portion to be exposed; etching the exposed portion of the first insulating film exposed in the bottom of the concave portion in depth direction and etching a side surface of the first insulating film in transverse direction to provide a hollow section having an exposed portion of the collector layer exposed in the bottom thereof and to form a visor section composed of a multiple-layered film having the polycrystalline semiconductor film, the second insulating film and the third insulating film; growing a base layer and a third semiconductor layer on the exposed portion of the collector layer exposed in the bottom of the hollow section, the base layer being composed of a first semiconductor layer and a second semiconductor layer, and growing a first polycrystalline semiconductor layer, a second polycrystalline semiconductor layer and a third polycrystalline semiconductor layer over the exposed portion of the polycrystalline semiconductor film exposed in the lower surface of the visor section to form a base coupling section, which is capable of electrically coupling the polycrystalline semiconductor film with the base layer; and injecting impurity of the first type conductivity into at least a portion of the third semiconductor layer to form an emitter layer, wherein the growing the base layer and the third semiconductor layer includes: growing the first polycrystalline semiconductor layer over the exposed portion of the polycrystalline semiconductor film exposed in the lower surface of the visor section, while growing the first semiconductor layer, the first polycrystalline semiconductor layer being undoped and the first semiconductor layer being undoped; selectively removing the first polycrystalline semiconductor layer; and selectively growing the second polycrystalline semiconductor layer and the third polycrystalline semiconductor layer over the exposed portion of the polycrystalline semiconductor film exposed in the lower surface of the visor section without contacting with the third insulating film, the second polycrystalline semiconductor layer containing impurity of second type conductivity and serving as the base coupling section and the third polycrystalline semiconductor layer being undoped, while growing the second semiconductor layer and the third semiconductor layer on the first semiconductor layer, the second semiconductor layer containing impurity of second type conductivity and the third semiconductor layer being undoped, so that the third semiconductor layer is in contact with the third polycrystalline semiconductor layer.

According to the above-described aspect of the present invention, the base layer and the third semiconductor layer is grown on the exposed portion of the collector layer exposed in the bottom of the hollow section, and, when the base coupling section is grown over the portion of the polycrystalline semiconductor film exposed in the lower surface of the visor section, which is composed of the multiple-layered film including the polycrystalline semiconductor film, the second insulating film and the third insulating film, the first polycrystalline semiconductor layer is grown over the polycrystalline semiconductor film in the lower surface of the visor section, and then such first polycrystalline semiconductor layer of is selectively removed. Thus, in the operation for selectively growing the second polycrystalline semiconductor layer and the third polycrystalline semiconductor layer, the second and the third polycrystalline semiconductor layers, which are grown over the polycrystalline semiconductor film, are selectively formed on the lower surface of the aforementioned visor section over the polycrystalline semiconductor film, so that a contact with the third insulating film is inhibited. This allows inhibiting a generation of a stress due to a difference in thermal expansion coefficient between the third insulating film and the polycrystalline semiconductor layer, thereby preventing a creation of recombination energy level, which would otherwise adversely affect the electrical characteristics of the semiconductor device. Further, the undoped first polycrystalline semiconductor layer is removed to form the second polycrystalline semiconductor layer that contains impurity of the second type conductivity directly on the polycrystalline semiconductor film. This reduces a parasitic resistance in the coupling section of the polycrystalline semiconductor film and the second polycrystalline semiconductor layer. The above described technical features allow reducing an electric current leakage and a parasitic resistance, and thus stable current gain can be obtained.

According to another aspect of the present invention, there is provided a semiconductor device having a hetero bipolar transistor, the hetero bipolar transistor including: a collector layer formed on a substrate and having a first type conductivity; a semiconductor layer, comprising a base layer containing impurity of a second type conductivity and epitaxially grown on the collector layer and an emitter layer partially containing impurity of the first type conductivity in a region thereof, the second type conductivity being inverse of the first type conductivity; a first insulating film provided outside of the semiconductor layer; a visor section, provided on the first insulating film, composed of a multiple-layered film including a polycrystalline semiconductor film having a second type conductivity, a second insulating film and a third insulating film, protruding toward the interior of the semiconductor layer in a direction along a surface of the substrate, and having an edge covered with the third insulating film; and a base coupling section, being longitudinally grown over an exposed portion of the polycrystalline semiconductor film exposed in the lower surface of the visor section, and composed of a polycrystalline semiconductor electrically coupling the polycrystalline semiconductor film with the base layer, wherein no contact between the base coupling section and the third insulating film is created in the lower surface of the visor section.

According to the above-described aspect of the present invention, the base coupling section composed of the polycrystalline semiconductor longitudinally grown on the portion of the polycrystalline semiconductor film exposed in the lower surface of the visor section has no contact with the third insulating film on the lower surface of the visor section. This allows inhibiting a generation of a stress according to a difference in thermal expansion coefficient between the third insulating film and the polycrystalline semiconductor layer, thereby preventing a creation of recombination energy level, which would otherwise adversely affect the electrical characteristics of the semiconductor device. This allows reducing an electric current leakage and a parasitic resistance, and thus stable current gain can be obtained.

According to the present invention, the semiconductor device, which provides reduced electric current leakage and parasitic resistance to achieve stable current gain, is provided.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
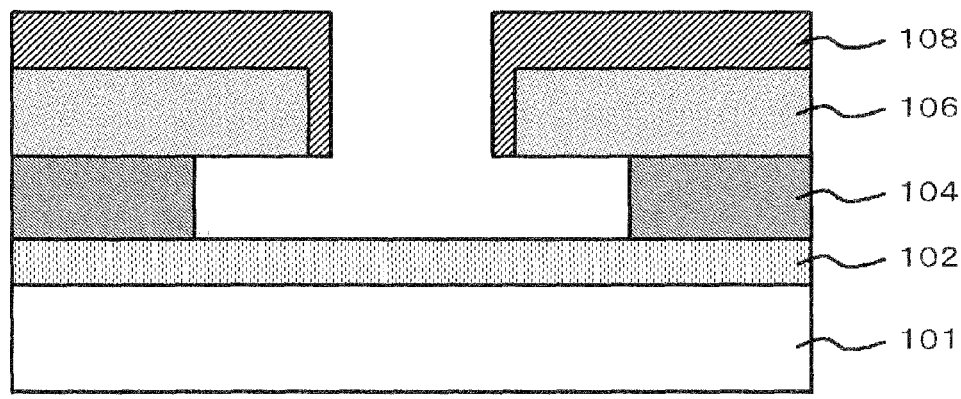
FIGS. 1A to 1C are cross-sectional views, illustrating a method for manufacturing a semiconductor device of a preferred embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in detail as follows in reference to the annexed figures. In all figures, an identical numeral is assigned to an element commonly appeared in the figures, and the detailed description thereof will not be repeated.

FIGS. 1A to 1C, FIGS. 2A and 2B and FIG. 3 are cross-sectional views illustrating a process for manufacturing a semiconductor device of a preferred embodiment. In the present embodiment, an exemplary implementation of npn type hetero bipolar transistor will be described.

A process for manufacturing a semiconductor device in the present embodiment is composed of the following process operations:

(a) an operation for providing, on a substrate 101 provided with a collector layer 102 having a first type conductivity (n-type collector layer), in sequence, a first insulating film 104 (silicon oxide film), a polycrystalline semiconductor film 106 having a second type conductivity (p-type polycrystalline silicon film) and a second insulating film (silicon nitride film), the second type conductivity being inverse of the first type conductivity;

(b) an operation for selectively etching the second insulating film and the p-type polycrystalline semiconductor film 106 to provide a concave portion in the bottom thereof having an exposed portion of the silicon oxide film 104;

(c) an operation for forming a third insulating film (silicon nitride film) on the second insulating film and on a side wall of the concave portion while partially leaving the concave portion;

(d) an operation for etching the portion of the silicon oxide film 104 exposed in the bottom of the concave portion in depth direction and etching a side surface of the silicon oxide film 104 in transverse direction to provide a hollow section having an exposed portion of the n-type collector layer 102 exposed in the bottom thereof and to form a visor section composed of a multiple-layered film including the p-type polycrystalline silicon film 106 and the silicon nitride film 108 (the second insulating film and the third insulating film);

(e) an operation for growing a base layer composed of a first semiconductor layer and a second semiconductor layer and a third semiconductor layer on the exposed portion of the n-type collector layer 102 exposed in the bottom of the hollow section, the base layer being, and growing a first, a second and a third polycrystalline semiconductor layers on the exposed portion of the p-type polycrystalline silicon film 106 exposed in the lower surface of the visor section to form a base coupling section, which is capable of electrically coupling the p-type polycrystalline silicon film 106 with the base layer; and (f) an operation for injecting impurity of the first type conductivity into at least a portion of the third semiconductor layer to form an emitter layer.

Further, the above-described process operation (e) includes the following process operations:

(i) a first growing operation for growing the undoped first polycrystalline semiconductor layer 120 on the portion of the p-type polycrystalline silicon film 106 exposed in the lower surface of the visor section, while growing the undoped first semiconductor layer 110;

(ii) an operation for selectively removing the first polycrystalline semiconductor layer 120; and (iii) a second growing operation for selectively growing the second polycrystalline semiconductor layer 112, 114 containing impurity of second type conductivity and the undoped third polycrystalline semiconductor layer 126 on the exposed portion of the polycrystalline semiconductor film exposed in the lower surface of the visor section without contacting the third insulating film (silicon nitride film), while growing the second semiconductor layer 112, 114 containing impurity of second type conductivity and the undoped third semiconductor layer 116 on the first semiconductor layer 110, so that the third semiconductor layer 116 is in contact with the third polycrystalline semiconductor layer 126.

The first and the second semiconductor layers 110, 112 and 114 and the first and the second polycrystalline semiconductor layers 120, 122 and 124 may contain silicon and germanium as constituent elements. Further, the first and the second semiconductor layers 110, 112 and 114 and the first and the second polycrystalline semiconductor layers 120, 122 and 124 may additionally contain carbon, in addition to silicon and germanium.

The above-described process for manufacturing the semiconductor device will be described in more detail as follows. An exemplary implementation of a hetero bipolar transistor, in which a multiple-layered structure of silicon germanium is adopted for a base layer, will be described.

First of all, the n-type collector layer 102 is formed on the substrate 101. For example, n-type impurity may be injected to the substrate 101 to obtain the n-type collector layer 102.

Subsequently, the silicon oxide film 104, the p-type polycrystalline silicon film 106 and the silicon nitride film serving as a second insulating film is formed, and then the silicon nitride film and the p-type polycrystalline silicon film 106 are selectively etched to provide a concave portion having the silicon oxide film 104 exposed in the bottom thereof. Further, the silicon nitride film serving as a third insulating film is deposited on the silicon nitride film and on the side wall of the concave portion while leaving the concave portion to form the silicon nitride film 108 composed of the second insulating film and the third insulating film. This allows forming the silicon nitride film, which has been deposited to serve as the third insulating film, on side wall of the concave portion. In this regard, the substrate 101 is a silicon substrate. The p-type polycrystalline silicon film 106 is provided for providing a coupling of the base layer with an electrode, and the thickness thereof is designed to be 200 nm in the present embodiment. The silicon nitride film 108 is formed for the purpose of preventing unwanted growth of crystal on the p-type polycrystalline silicon film 106 in the epitaxial growing process, and the silicon nitride film may be typically deposited on, for example, the side wall of the concave portion to be 90 nm thick and on the surface thereof to be 180 nm thick.

Next, the silicon oxide film 104 exposed in the bottom of the concave portion is etched toward the depth direction and is also etched toward the transverse direction to provide a hollow section having the exposed portion of the n-type collector layer 102 in the bottom thereof. Such etching of the silicon oxide film 104 achieves a formation of the visor section composed of the multiple-layered film including the p-type polycrystalline silicon film 106 and the silicon nitride film 108 (FIG. 1A).

The thickness of the silicon oxide film 104 is designed to be, for example, 90 nm, and the etching in the transverse direction is continued until the side surface thereof is etched by about 1.5 µm from the edge of the visor section to ensure providing a sufficient base layer coupling region. Further, a buffered hydrofluoric acid may be employed for the etching of the silicon oxide film 104.

Subsequently, an epitaxial growing is achieved via a chemical vapor deposition (CVD) process. Process conditions for such epitaxial growing may be, for example, at a temperature within a range of from 650 degree C. to 850 degree C. and at a pressure within a range of from 150 Pa to 1300 Pa, and a source gas may contain: hydrogen gas as a carrier gas; a gaseous mixture of germane gas (GeH$_4$), a chlorine-containing silane gas (for example: SiH$_2$Cl$_2$) and hydrogen chloride (HCl) as a deposition gas; and boron-containing gas (for example: B2H6) as p-type dopant for the base. Further, when a crystal containing carbon (SiGe: C) is grown, methylsilane gas (SiH$_3$CH$_3$) may be employed.

First of all, a first deposition for forming a SiGe buffer layer 110 serving as an undoped first semiconductor layer is conducted. While the undoped SiGe buffer layer 110 is grown on the portion of the n-type collector layer 102 exposed in the bottom of the hollow section, the undoped first polycrystalline semiconductor layer (polycrystalline SiGe layer 120) is downwardly grown on the portion of the p-type polycrystalline silicon film 106 exposed in the lower surface of the visor section (FIG. 1B).

Figure 1B:
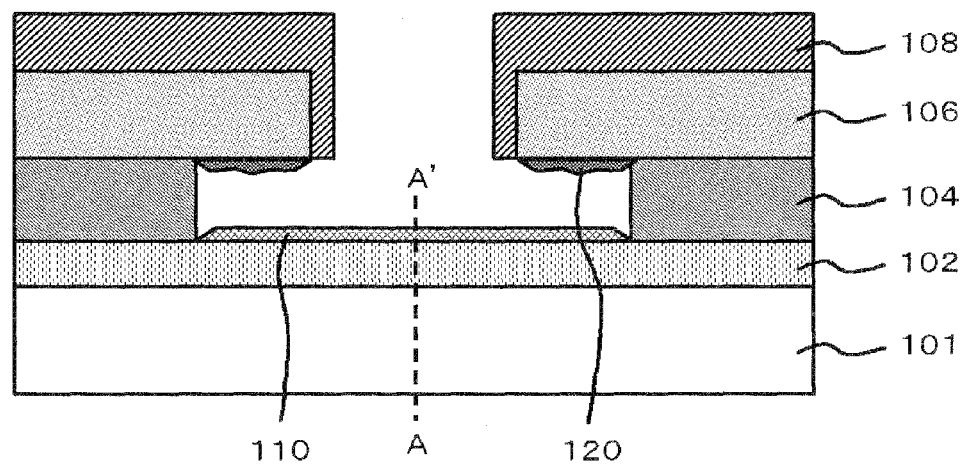
Figure 1C:
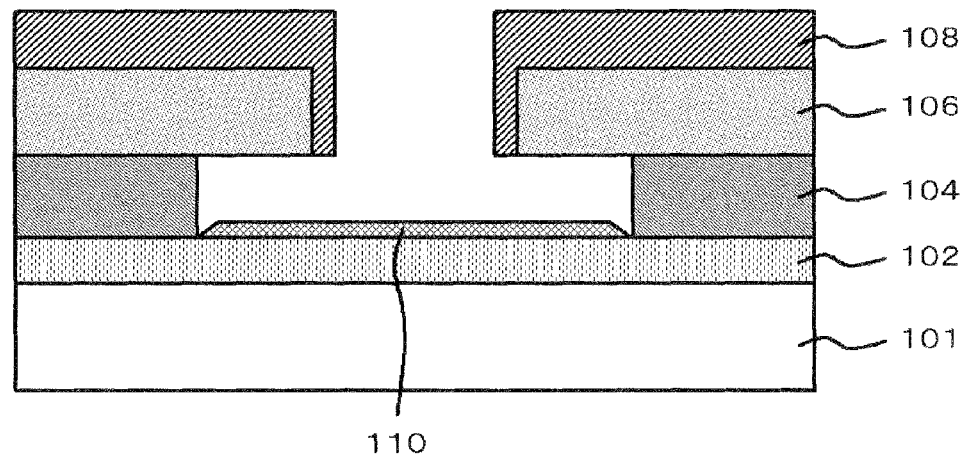
Figure 4:
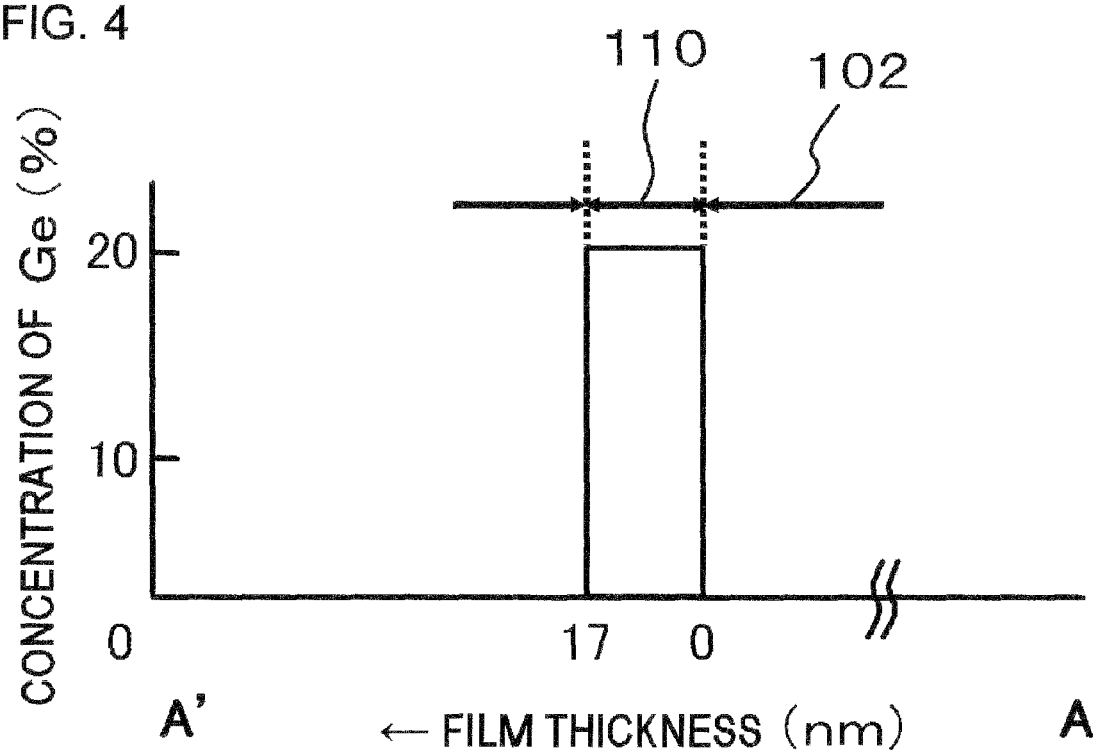
FIG. 4 is a diagram, showing Ge concentration profile in depth direction in cross section along line A-A' in FIG. 1B.

Germanium (Ge) concentration profile of the cross section in the depth direction along line A-A' of FIG. 1B is shown in FIG. 4. The concentration of Ge in SiGe buffer layer 110 is 20%, and the thickness is about 17 nm. In same time, the undoped polycrystalline SiGe layer 120 is grown on the exposed lower portion of the p-type polycrystalline silicon film 106 to a thickness that is substantially equivalent to or thicker than the SiGe buffer layer 110.

Next, the undoped polycrystalline SiGe layer 120 grown on the p-type polycrystalline silicon film 106 is removed. Typical method for removing the polycrystalline SiGe layer 120 involves conducting a CVD process for predetermined time at a pressure within a CVD chamber set to be higher than a pressure employed in the first growing operation for growing the first polycrystalline semiconductor layer on the portion of the polycrystalline semiconductor film and employing a gaseous mixture of hydrogen and HCl gas within a gas atmosphere. This allows inhibiting the etching of the SiGe buffer layer 110, so that only the undoped polycrystalline SiGe layer 120 can be removed. For example, when the undoped polycrystalline SiGe layer 120 having a thickness of 20 nm is processed to be removed, a thickness of the removed SiGe buffer layer 110 by such process is 2 nm, which is approximately ¹/₁₀ of the thickness of the undoped polycrystalline SiGe layer 120, and thus the thickness of the processed SiGe buffer layer 110 is about 15 nm.

Figure 7:
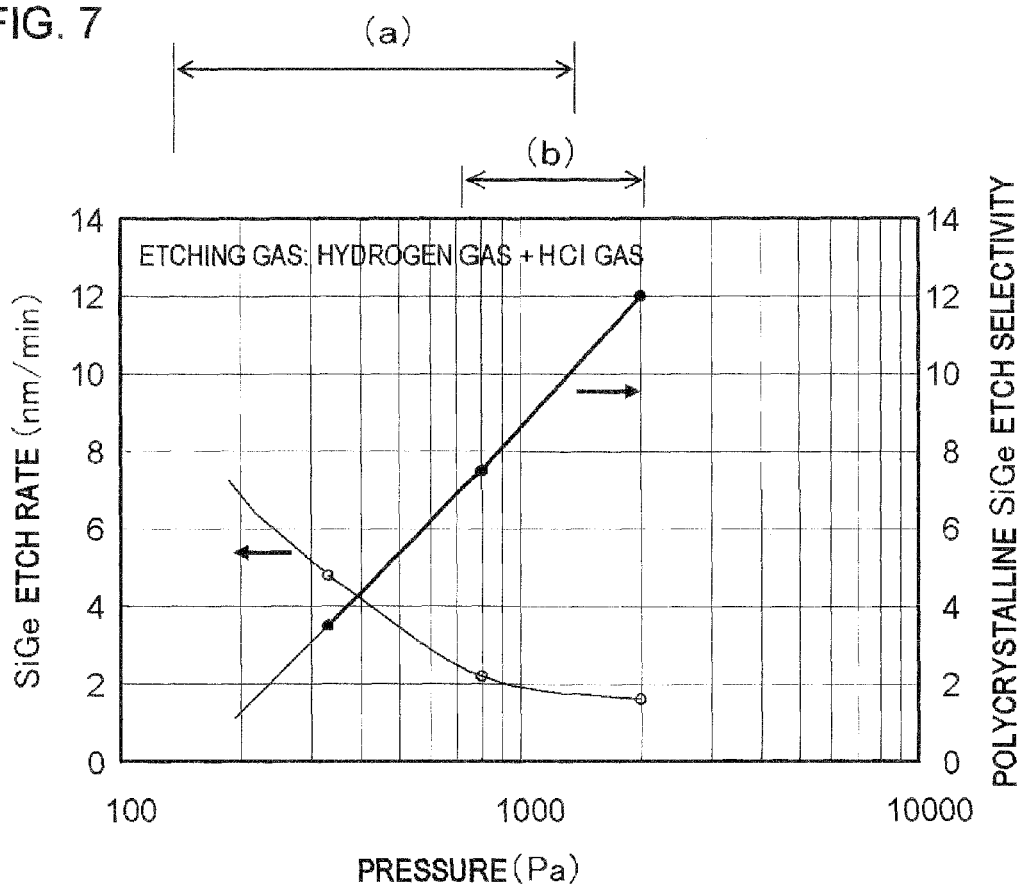
FIG. 7 is a graph, showing a pressure dependency in an etch selectivity of polycrystalline SiGe over monocrystalline SiGe within an atmosphere of a gaseous mixture of hydrogen ($H_2$) and hydrogen chloride (HCl) gas.

Graph of FIG. 7 shows a pressure dependency in an etch selectivity of polycrystalline SiGe over monocrystalline SiGe within an atmosphere of a gaseous mixture of hydrogen (H$_2$) and hydrogen chloride (HCl) gas. It can be seen from the graph that higher pressure provides lower etch rate for monocrystalline SiGe, leading to higher etch selectivity of polycrystalline SiGe over monocrystalline SiGe. Consequently, polycrystalline SiGe layer 120 can be selectively etched by utilizing a pressure range (b) that is higher than a pressure range (a) employed for a deposition of monocrystalline SiGe within an atmosphere of hydrogen and HCl gas.

Figure 2A:
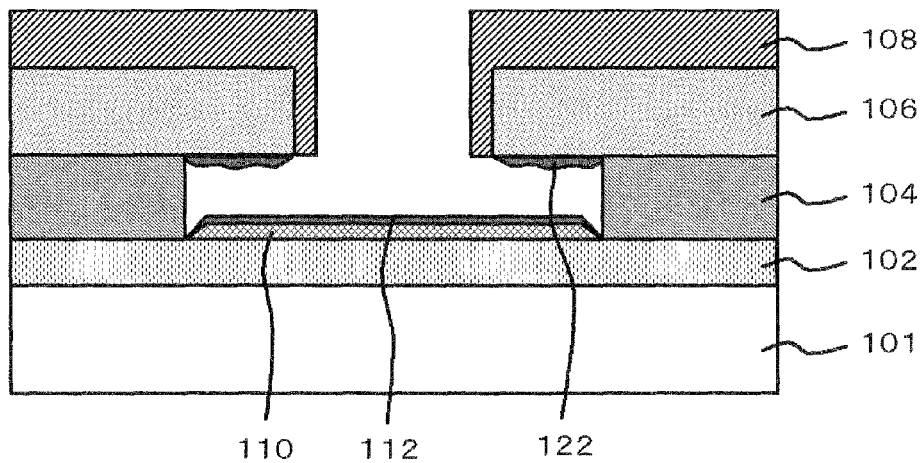
FIGS. 2A and 2B are cross-sectional views, illustrating the method for manufacturing the semiconductor device of the preferred embodiment.

Next, the second growing operation for selectively growing the second polycrystalline semiconductor layer is conducted. First of all, the second semiconductor layer containing p-type impurity (p-type SiGe layer 112 and SiGe layer 114) and the second polycrystalline semiconductor layer containing p-type impurity (p-type polycrystalline SiGe layer 122 and polycrystalline SiGe layer 124) are grown. A deposition gas containing diborane (B$_2$H$_6$) gas as a dopant for forming p$^+$ base layer is employed to deposit the p-type SiGe layer 112 containing Ge at a ratio of 20% and additionally containing boron at a concentration of $1 \times 10^{19}$ atoms/cm$^3$ to a thickness of 5 nm on the SiGe buffer layer 110. In such occasion, the p-type polycrystalline SiGe layer 122 is deposited on the portion of the p-type polycrystalline silicon film 106 exposed in the lower surface of the visor section (FIG. 2A).

Figure 2B:
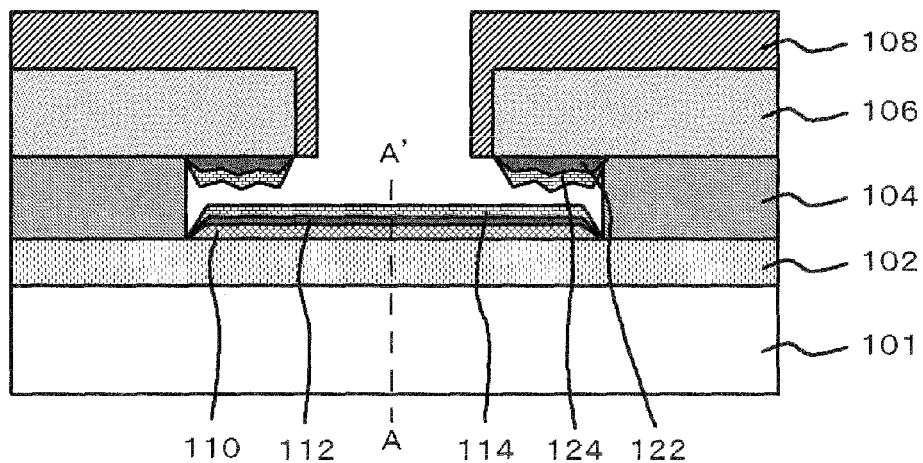
Figure 5:
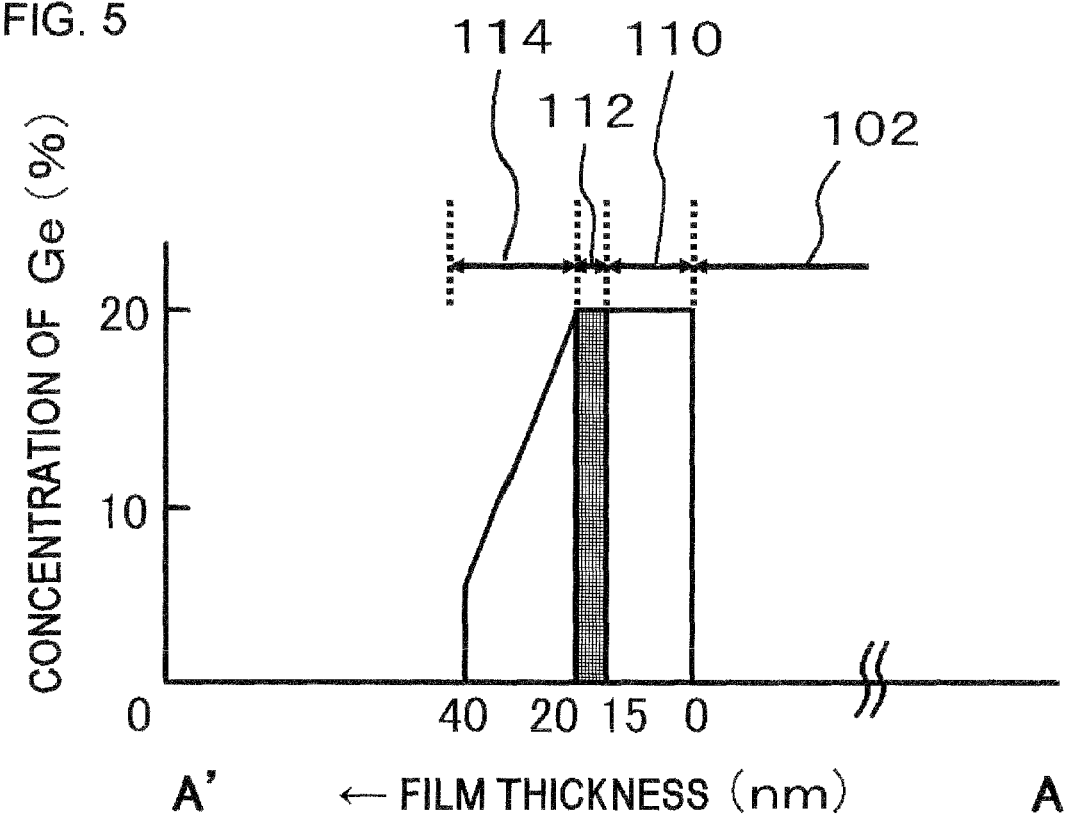
FIG. 5 is a diagram, showing Ge concentration profile in depth in cross section along line A-A' in FIG. 2B.

Subsequently, the flow rate of the deposition gas is suitably adjusted to form the SiGe layer 114 having an inclined distribution of germanium (Ge) concentration, in which Ge concentration is decreased from the side of the substrate toward the longitudinal direction. More specifically, a supply of B2H6 gas is stopped and the flow rate of GeH$_4$ gas is suitably reduced, so that the undoped SiGe layer 114 having an inclined distribution of ratio of Ge concentration from 20% to 5% is deposited to a thickness of 20 nm. The polycrystalline SiGe layer 124 is formed on the p-type polycrystalline SiGe layer 122. In this stage, a gap of about the 30 nm is present between the polycrystalline SiGe layer 124 and the SiGe layer 114, and thus is in a condition without coupling therebetween (FIG. 2B). In addition to above, FIG. 5 shows a profile of Ge concentration in the cross section along line A-A' in the depth direction shown in FIG. 2B.

Figure 3:
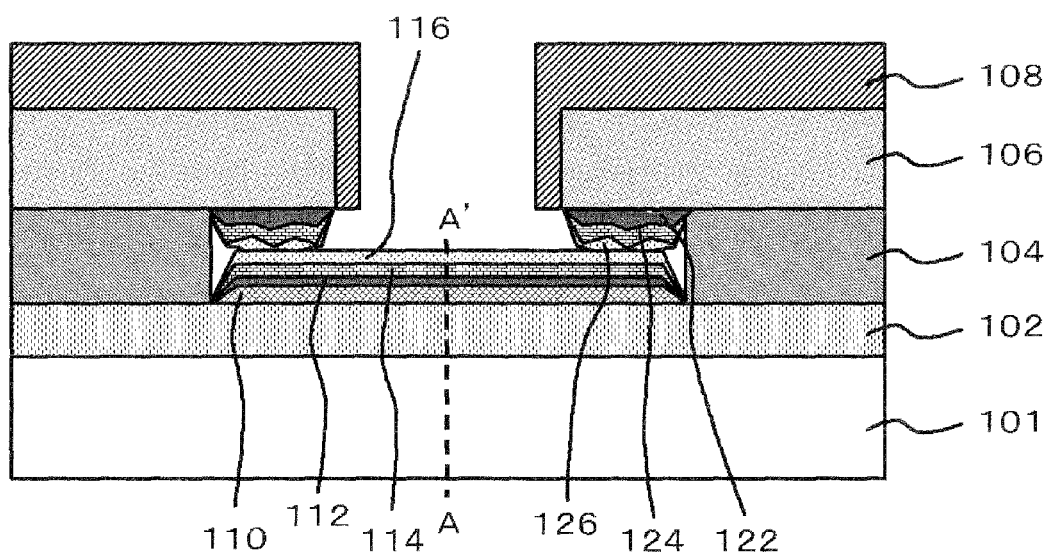
FIG. 3 is a cross-sectional view, illustrating the method for manufacturing the semiconductor device of the preferred embodiment.
Figure 6:
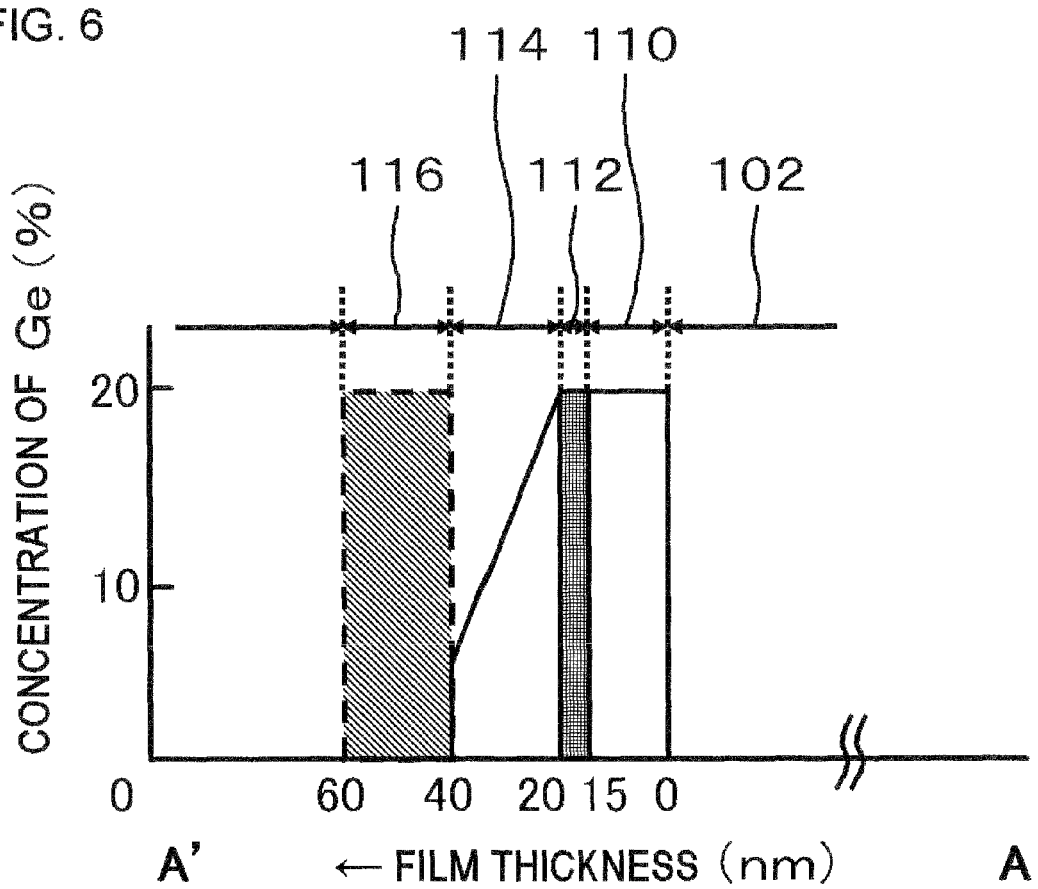
FIG. 6 is a diagram, showing Ge concentration profile in depth in cross section along line A-A' in FIG. 3.

Further, hydrogen is employed for a carrier gas, and a chlorine-containing silane gas (for example: SiH$_2$Cl$_2$) and hydrogen chloride is employed for deposition gas, so that silicon is epitaxially grown on the SiGe layer 114 to form the cap Si layer 116 to a thickness of 20 nm. In such growing process, the polycrystalline Si layer 126 is grown on the polycrystalline SiGe layer 124. This results in providing a base coupling section, which is composed of the p-type polycrystalline SiGe layer 122, the polycrystalline SiGe layer 124 and the polycrystalline Si layer 126, and is in contact with the cap Si layer 116 so that a geometric relationship of the polycrystalline layer being coupled with the monocrystalline layer is obtained as shown in FIG. 3. FIG. 6 shows a profile of Ge concentration in the cross section along line A-A' in the depth direction in shown in FIG. 3. While the cap Si layer 116 is indicated by dotted lines to represent a reference film thickness in the diagram, such dotted lines is not intended to show Ge composition.

As shown in FIG. 3, the base coupling section composed of the p-type polycrystalline SiGe layer 122, the polycrystalline SiGe layer 124 and the polycrystalline Si layer 126 is formed selectively on the p-type polycrystalline silicon film 106 in the lower surface of the visor section without contacting with the silicon nitride film 108. This allows inhibiting a generation of a stress according to a difference in thermal expansion coefficient between the silicon nitride film 108 and the polycrystalline semiconductor of the base coupling section.

Further, the polycrystalline SiGe layer 120 deposited on the p-type polycrystalline silicon film 106 is removed, and the p-type polycrystalline SiGe layer 122 is deposited on the p-type polycrystalline silicon film 106. This allows reducing the sheet resistance of the coupling section between the base layer and the base drawing electrode.

As described above, according to the method for manufacturing the semiconductor device of the present embodiment, the first growing operation for growing the undoped first polycrystalline semiconductor layer 120, the operation for selectively removing the first polycrystalline semiconductor layer 120 and the second growing operation for selectively growing the second polycrystalline semiconductor layer 112 and 114 can be sequentially conducted in one chemical vapor deposition apparatus. This allows removing the polycrystalline SiGe layer 120 without adversely affecting the processing efficiency.

Hereafter, necessary processing for forming an emitter layer such as forming a collector layer by injecting n-type impurity into the cap Si layer 116 via, for example, an ion implanting or a diffusion process. Next, a thermal processing such as a rapid thermal annealing (RTA) is conducted at a temperature within a range of from 880 degree C. to 950 degree C. to cause a diffusion of p$^+$ dopant from the p-type polycrystalline SiGe layer 122 and the p-type SiGe layer 112, so that an electric coupling of the base coupling section composed of the p-type polycrystalline SiGe layer 122, the polycrystalline SiGe layer 124 and the polycrystalline Si layer 126 and an electric coupling of the base layer and the p-type polycrystalline silicon film 106 serving as a base drawing electrode through the cap Si layer 116 are achieved.

Figure 8:
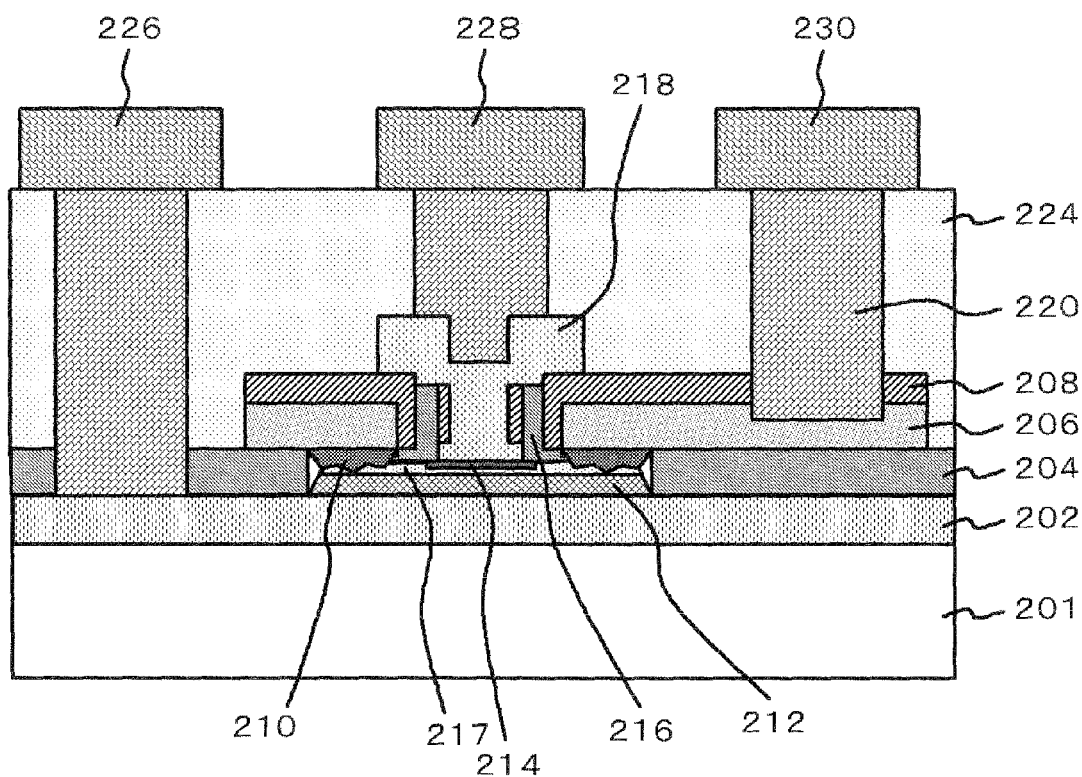
FIG. 8 is a cross-sectional view, schematically illustrating a semiconductor device of the preferred embodiment.

FIG. 8 is a cross-sectional view, schematically showing a semiconductor device 200 formed in such process. On the n-type collector layer 202 formed on the substrate 201, the p-type base layer 212, which has been epitaxially grown, and an emitter region 214 created by partially injecting n-type impurity in an emitter layer 217 are formed in the above-described process. A silicon oxide film (first insulating film) 204 is formed outside of a semiconductor layer composed of the base layer 212 and the emitter layer 217 on the collector layer 202. Further, a multiple-layered film composed of the p-type polycrystalline silicon film 206 and the silicon nitride film 208 (second insulating film, third insulating film) is formed on the silicon oxide film 204.

Further, the semiconductor device 200 is also configured that the p-type polycrystalline silicon film 206 and the silicon nitride film 208 protrude along the direction in the surface of the substrate 201 toward the inside of the base layer 212 to form a visor section above the base layer 212, an end section of which is covered with a silicon nitride film. Further, the lower surface of the visor section is provided with a base coupling section 210 composed of a polycrystalline semiconductor, which is capable of electrically coupling the p-type polycrystalline silicon film 206 with the base layer 212.

An emitter polysilicon 218 is formed on the emitter region 214, and further, an interlayer insulating film 224 is provided on the substrate 201. Tungsten plugs 220, each extending to the collector layer 202, the emitter polysilicon 218 and the p-type polycrystalline silicon film 206, respectively, are provided in the interlayer insulating film 224, and the tungsten plugs 220 comprise a collector electrode 226, an emitter electrode 228 and a base electrode 230, respectively.

The semiconductor device 200 is configured that a thickness of the polycrystalline semiconductor layer 210 is smaller than a thickness of the base layer 212, and no contact of the polycrystalline semiconductor layer 210 with the silicon nitride film 208 is made in the lower surface of the visor section. This allows inhibiting a generation of a stress according to a difference in thermal expansion coefficient between the silicon nitride film 208 and the polycrystalline semiconductor layer 210, thereby preventing an increase in the base current leakage in the emitter-base junction.

Further, a thickness of the base coupling section 210 is preferably smaller than a total thickness of the base layer 212 and the emitter layer 217. This allows inhibiting an excessive deposition of the polycrystalline semiconductor layer 210, thereby preventing the base coupling section 210 from being in contact with the silicon nitride film 208. Thus, a generation of a stress according to a difference in thermal expansion coefficient between the base coupling section 210 and the polycrystalline semiconductor can be inhibited, thereby preventing an increase in the base current leakage in the emitter-base junction.

Next, advantageous effects obtainable by employing the configuration of the present embodiment will be described.

According to the present embodiment, the polycrystalline SiGe layer 120, which is deposited on the p-type polycrystalline silicon film 106 in the lower surface of the visor section including the p-type polycrystalline silicon film 106 and the silicon nitride film 108, is selectively removed. Thus, the p-type polycrystalline SiGe layer 122, the polycrystalline SiGe layer 124 and the polycrystalline Si layer 126, which have been deposited on the p-type polycrystalline silicon film 106 in the second growing operation, is selectively formed on the exposed portion of the p-type polycrystalline silicon film 106 in the lower surface of the visor section without being in contact with the silicon nitride film 108. This allows inhibiting a generation of a stress according to a difference in thermal expansion coefficient between the silicon nitride film 108 and the polycrystalline semiconductor layer, thereby preventing a creation of recombination energy level, which would otherwise adversely affect the electrical characteristics of the semiconductor device. Further, the undoped polycrystalline SiGe layer 120 is removed and the p-type polycrystalline SiGe layer 122 is formed directly on the p-type polycrystalline silicon film 106. Thus, reduced sheet resistance can be achieved in the base layer coupling region. These technical aspects provide reduced electric current leakage and parasitic resistance to achieve stable current gain.

Figure 9:
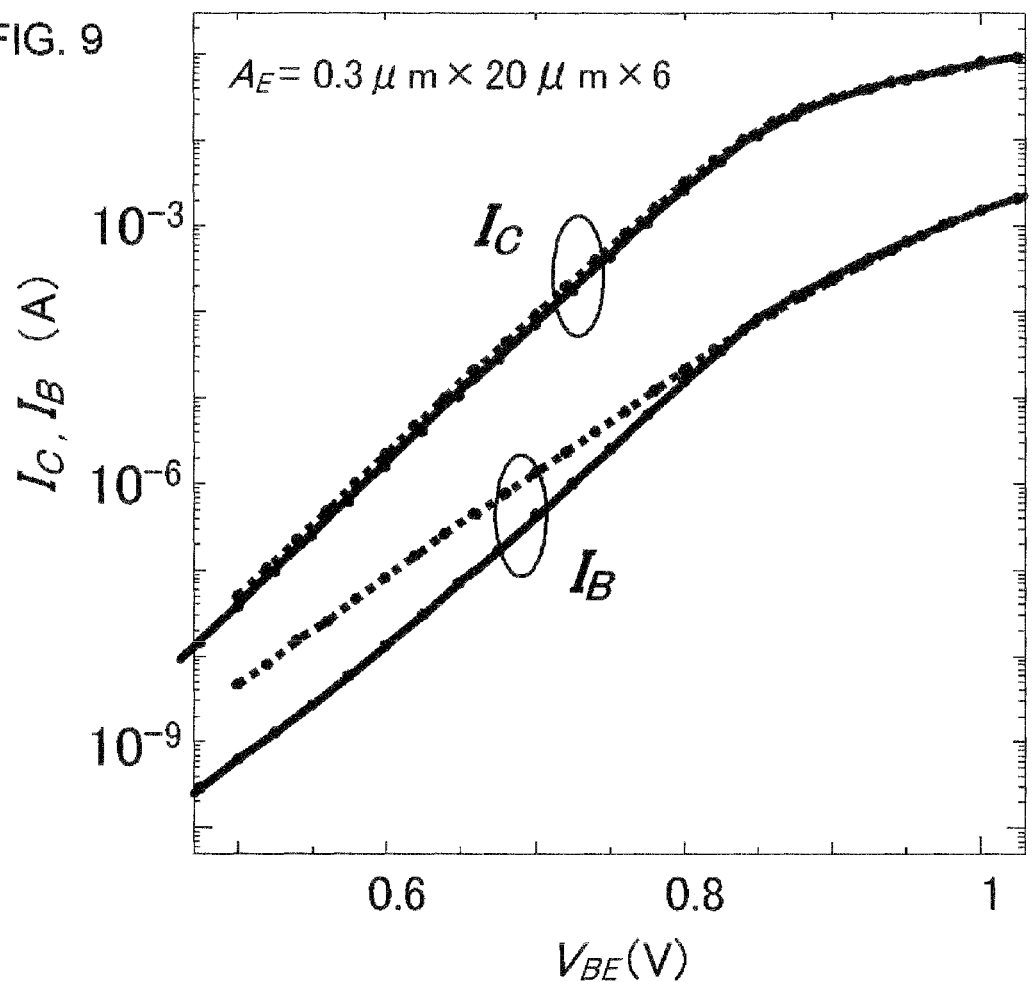
FIG. 9 is a graph, showing voltage dependency (Gummel plots) between base and emitter for the base current and the collector current.

Voltage dependency (Gummel plots) between base and emitter for the base current and the collector current of the semiconductor device 200 shown in FIG. 8 is shown in FIG. 9. In the graph, results of the semiconductor device 200 is shown by solid lines, and results of a conventional semiconductor device configured that the polycrystalline semiconductor layer is in contact with the silicon nitride film is shown by dotted lines as a comparative example. It can be seen from that graph that an increase of a base current leakage in an emitter-base junction is avoided in the semiconductor device of the present embodiment according to the present invention, unlike as in the comparative example.

Figure 10:
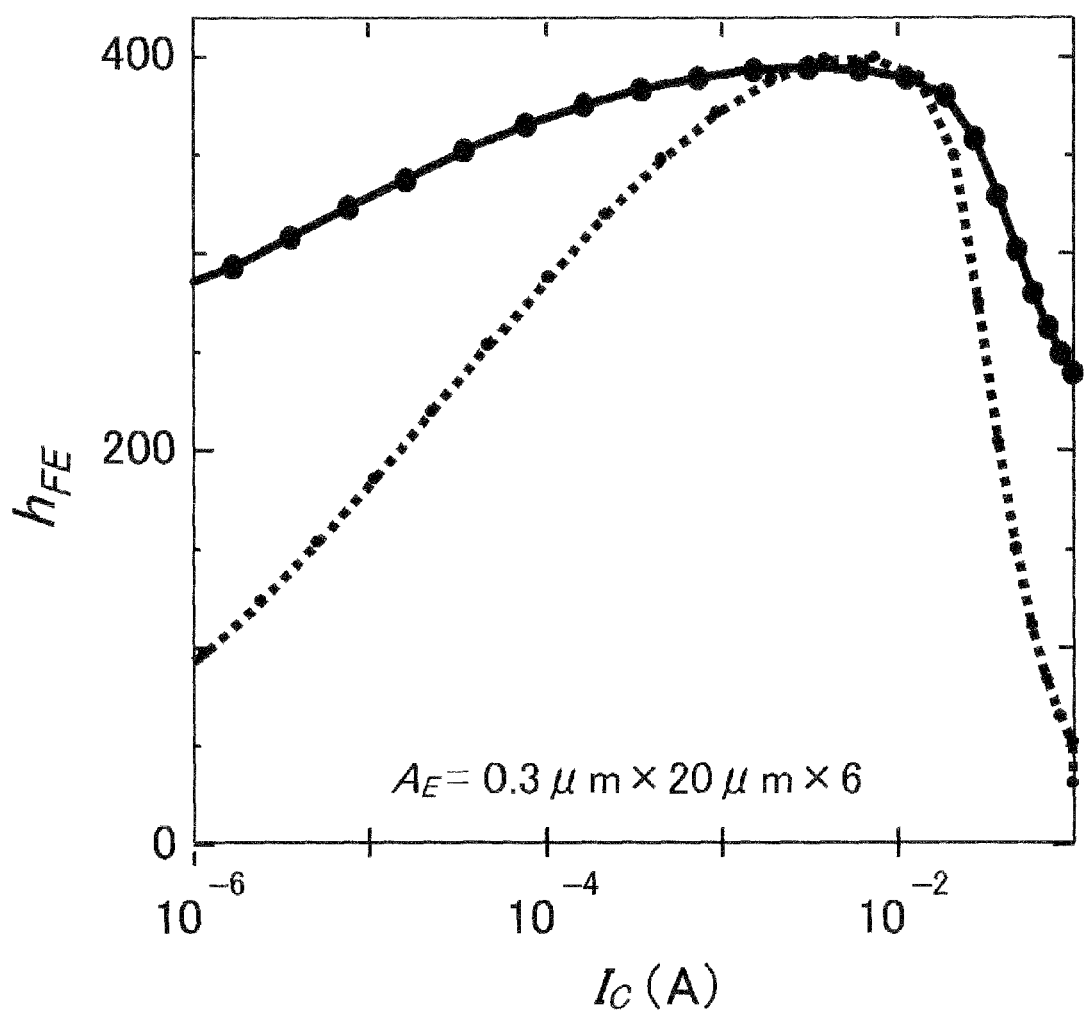
FIG. 10 is a diagram, showing characteristics of $h_{FE}$ (forward current gain) over collector current.
Figure 11A:
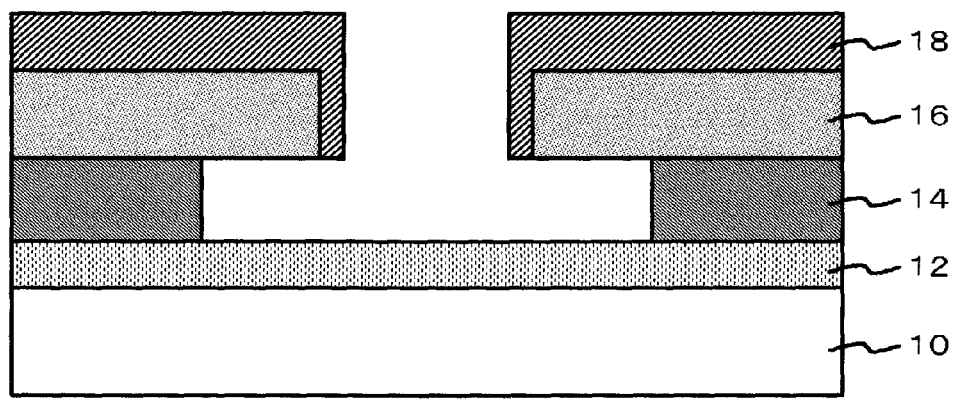
FIGS. 11A to 11C are cross-sectional views, illustrating a conventional method for manufacturing a semiconductor device.
Figure 11B:
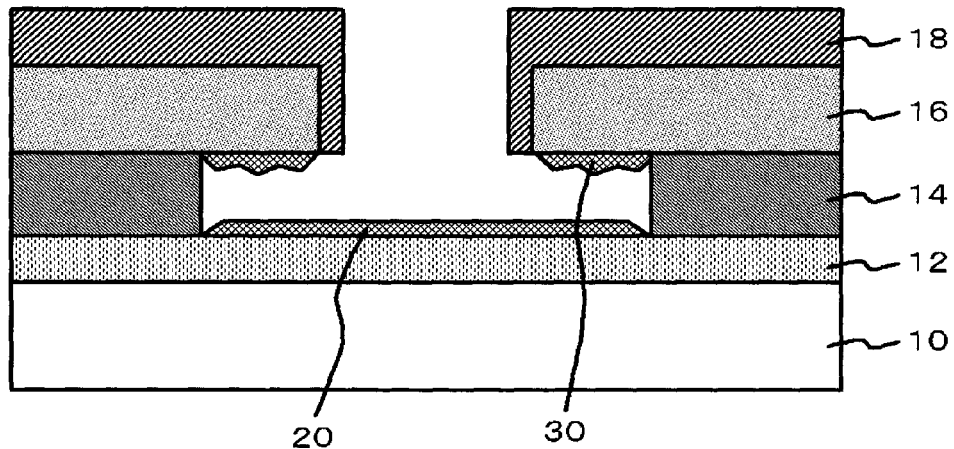
Figure 11C:
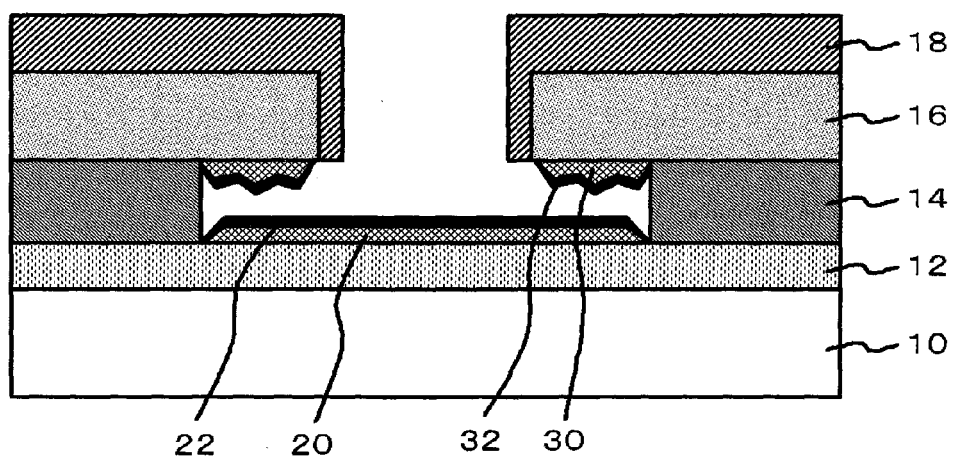
Figure 12:
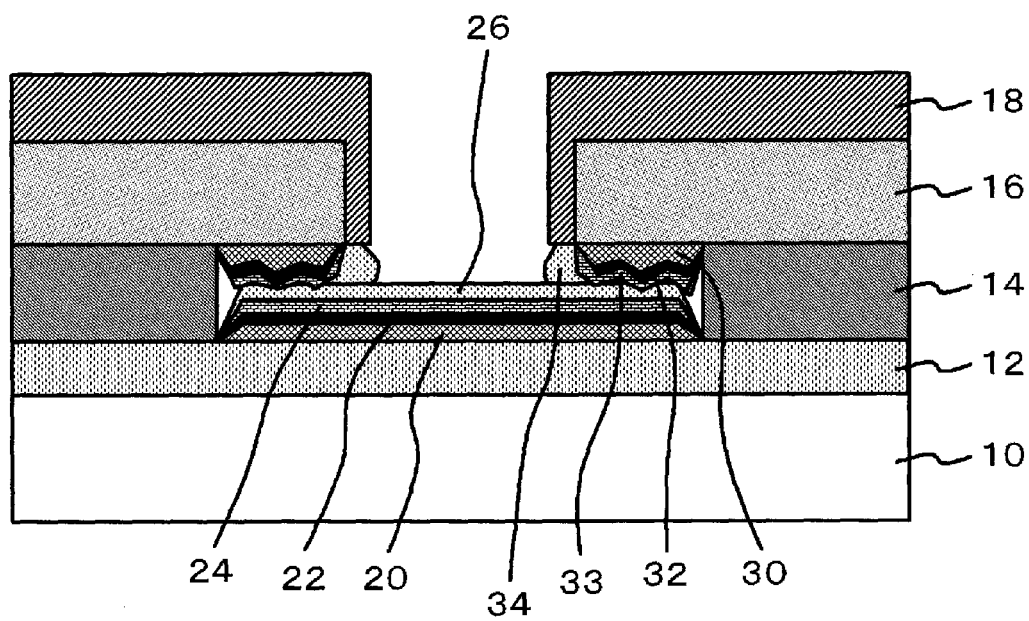
FIG. 12 is a process cross-sectional view, illustrating a conventional method for manufacturing the semiconductor device.

Further, characteristics of $h_{FE}$ (forward current gain) over collector current are shown in FIG. 10. Similarly as in FIG. 9, results of the semiconductor device of the present embodiment is shown by a solid line, and results of a conventional semiconductor device configured that the polycrystalline semiconductor layer is in contact with the silicon nitride film is shown by a dotted line as a comparative example. For example, concerning $h_{FE}$ in cases of collector current of from $1 \times 10^{-4}$ A to $1 \times 10^3$ A, while changes in $h_{FE}$ for comparative example is 30% or higher, reduced changes in $h_{FE}$ equal to or lower than 10% is achieved for the semiconductor device of the present embodiment, and therefore the present embodiment can provide stable $h_{FE}$ characteristic. According to the technical aspects as described above, stable current gain can be obtained according to the semiconductor device of the present embodiment.

One reason for preventing the polycrystalline semiconductor layer from being in contact with the silicon nitride film by employing the method for manufacturing the semiconductor device in the present embodiment will be described.

Crystal orientation of the p-type polycrystalline silicon film employed for the base drawer is mainly (111) orientation, and besides (220) orientation and (311) orientation coexists therein, and further, orientation of crystallite itself is randomly presented. Therefore, the growth of the polycrystalline SiGe is more easily progressed in random orientations, as compared with a SiGe layer grown on a monocrystalline silicon substrate having single orientation, and transverse component of the crystal growth is increased. Further, the monocrystalline layer grown from the side of the collector substrate and the polycrystalline layer grown from the side of the p-type polycrystalline silicon film are coupled respectively in the process for epitaxially growing the base layer, and then the growth of the polycrystalline layer proceeds in the transverse direction, causing an increased probability of being in contact with the silicon nitride film exposed in the lower surface of the visor section.

However, since the polycrystalline SiGe layer 120 is selectively removed to suitably adjust the thickness of the polycrystalline layer in the present embodiment, a crystal growth in the transverse direction can be inhibited.

A formation of the base layer in the opening provided in the insulating layer by utilizing a crystal growth is disclosed in Japanese Patent Application Publication No. 2004-193454. In this regard, a p-type polycrystalline silicon-germanium layer is grown while a p-type single crystalline silicon-germanium layer is also grown, and, from a contact therebetween, the p-type single crystalline silicon germanium layer is further grown in the longitudinal direction, such that the p-type polycrystalline silicon germanium layer is grown along the transverse direction. It is considered that this results in the p-type polycrystalline silicon germanium layer being in contact with the insulating film provided in the emitter base isolation region. Further, according to the description of Japanese Patent Application Publication No. 2004-193454, it is difficult to form the p-type polycrystalline silicon germanium layer while preventing the p-type polycrystalline silicon germanium layer from being in contact with the insulating film.

While the embodiments of the present invention has been fully described above in reference to the annexed figures, it is intended to present these embodiments for the purpose of illustrations of the present invention only, and various modifications other than that described above are also available.

For example, while the exemplary implementation of the hetero bipolar transistor having the monocrystalline semiconductor layer and the polycrystalline semiconductor layer containing silicon and germanium or silicon, germanium and carbon as constituent elements are described in the above embodiments, similar advantageous effects can also be obtained by employing a bipolar transistor containing only silicon among the above-described constituent elements.

It is apparent that the present invention is not limited to the above embodiment, and may be modified and changed without departing from the scope and spirit of the invention.

What is claimed is:

1. A semiconductor device having a hetero bipolar transistor, said hetero bipolar transistor including:

a collector layer formed on a substrate and having a first type conductivity;

a semiconductor layer, comprising a base layer containing impurity of a second type conductivity and epitaxially grown on said collector layer and an emitter layer partially containing impurity of said first type conductivity in a region thereof, said second type conductivity being inverse of said first type conductivity;

a first insulating film provided outside of said semiconductor layer;

a visor section, provided on said first insulating film, composed of a multiple-layered film including a polycrystalline semiconductor film having a second type conductivity, a second insulating film and a third insulating film, protruding toward said interior of said semiconductor layer in a direction along a surface of said substrate, and having an edge covered with said third insulating film; and a base coupling section, being longitudinally grown over an exposed portion of said polycrystalline semiconductor film exposed in the lower surface of said visor section, and composed of a polycrystalline semiconductor electrically coupling said polycrystalline semiconductor film with said base layer, wherein no contact between said base coupling section and said third insulating film is created in the lower surface of said visor section.

2. The semiconductor device as set forth in claim 1, wherein a thickness of said base coupling section is smaller than a total thickness of said base layer and said semiconductor layer.

* * * * *